United States Patent
Tetelbaum et al.

(10) Patent No.: US 6,810,505 B2
(45) Date of Patent: Oct. 26, 2004

(54) INTEGRATED CIRCUIT DESIGN FLOW WITH CAPACITIVE MARGIN

(75) Inventors: Alexander Tetelbaum, Hayward, CA (US); Maad A. Al-Dabagh, Sunnyvale, CA (US); Duc Van Huynh, San Jose, CA (US); Ruben Molina, Jr., San Ramon, CA (US)

(73) Assignee: LSI Logic Corporation, Milpitas, CA (US)

( * ) Notice: Subject to any disclaimer, the term of this patent is extended or adjusted under 35 U.S.C. 154(b) by 168 days.

(21) Appl. No.: 10/192,989

(22) Filed: Jul. 10, 2002

(65) Prior Publication Data
US 2004/0010761 A1 Jan. 15, 2004

(51) Int. Cl.[7] .............................. G06F 17/50; G06G 7/62
(52) U.S. Cl. ................................ 716/1; 716/4; 716/12; 716/19; 716/6; 716/11; 703/13
(58) Field of Search .............................. 716/1, 4, 12, 6, 716/11, 19; 703/13

(56) References Cited

U.S. PATENT DOCUMENTS

| | | | | |
|---|---|---|---|---|
| 5,535,133 A | * | 7/1996 | Petschauer et al. | 716/19 |
| 5,555,506 A | * | 9/1996 | Petschauer et al. | 703/13 |
| 5,568,395 A | * | 10/1996 | Huang | 716/4 |
| 5,610,833 A | * | 3/1997 | Chang et al. | 716/11 |
| 6,209,122 B1 | * | 3/2001 | Jyu et al. | 716/6 |
| 6,253,359 B1 | * | 6/2001 | Cano et al. | 716/6 |
| 6,286,126 B1 | * | 9/2001 | Raghavan et al. | 716/6 |
| 6,353,917 B1 | * | 3/2002 | Muddu et al. | 716/6 |
| 6,378,109 B1 | * | 4/2002 | Young et al. | 716/4 |
| 6,381,730 B1 | * | 4/2002 | Chang et al. | 716/5 |
| 6,449,753 B1 | * | 9/2002 | Aingaran et al. | 716/5 |
| 6,487,705 B1 | * | 11/2002 | Roethig et al. | 716/6 |
| 6,499,131 B1 | * | 12/2002 | Savithri et al. | 716/5 |
| 6,557,145 B2 | * | 4/2003 | Boyle et al. | 716/2 |
| 6,591,407 B1 | * | 7/2003 | Kaufman et al. | 716/10 |
| 2003/0051222 A1 | * | 3/2003 | Williams et al. | 716/12 |

OTHER PUBLICATIONS

Y. Sasaki et al., Multi–Aggressor Relative Window Method for Timing Analysis Including Crosstalk Delay Degradation, IEEE 2000 Custom Integrated Circuits Conference, pp. 495–498, May 2000.*

K–J Chang et al., HIVE: An Express and Accurate Interconnect Capacitance Extractor for Submicron Multilevel Conductor Systems, Eight International IEEE VLSI Multilevel Interconnection Conference, pp. 359–363, Jun. 1991.*

60/315,995.*

Lun Ye et al., Chip–Level Verification for Parasitic Coupling Effects in Deep–Submicron Digital Designs, Proceedings of Design, Automation and Test in Europe Conference and Exhibition, pp. 658–663, Mar. 1999.*

P.B. Sabet et al., A Model for Crosstalk Noise Evaluation in Deep Submicron Processes, 2001 International Symposium on Quality Electronic Design, pp. 139–144, Mar. 2001.*

* cited by examiner

Primary Examiner—A. M. Thompson
(74) Attorney, Agent, or Firm—Fitch, Even, Tabin & Flannery

(57) ABSTRACT

A method of designing an integrated circuit includes receiving as input a representation of a circuit design and a margin factor and scaling a parameter value in the circuit design by the margin factor to account for coupling in the circuit design. The margin factor advantageously reduces the number of iterations in the design flow and avoids the necessity of cross-talk analysis.

11 Claims, 2 Drawing Sheets

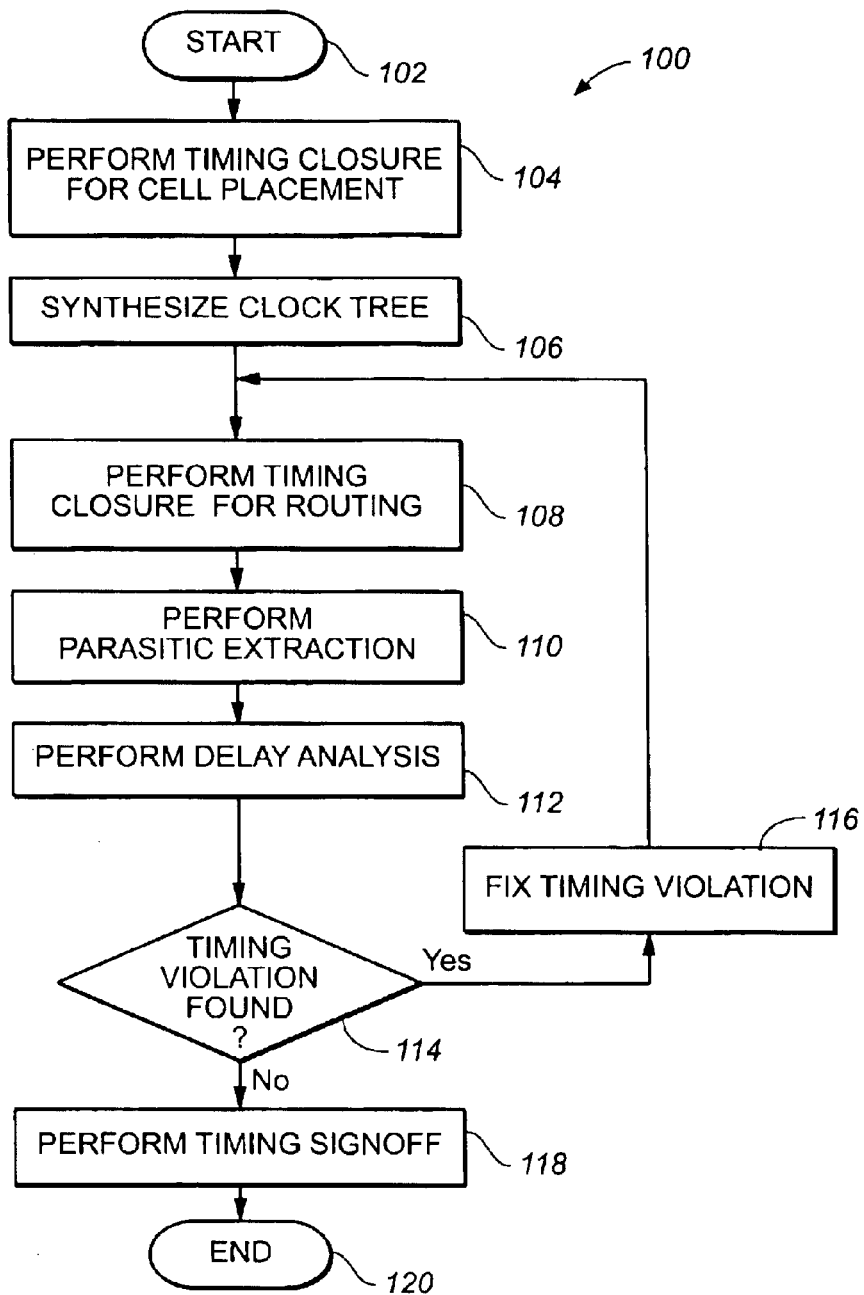
FIG._1
(PRIOR ART)

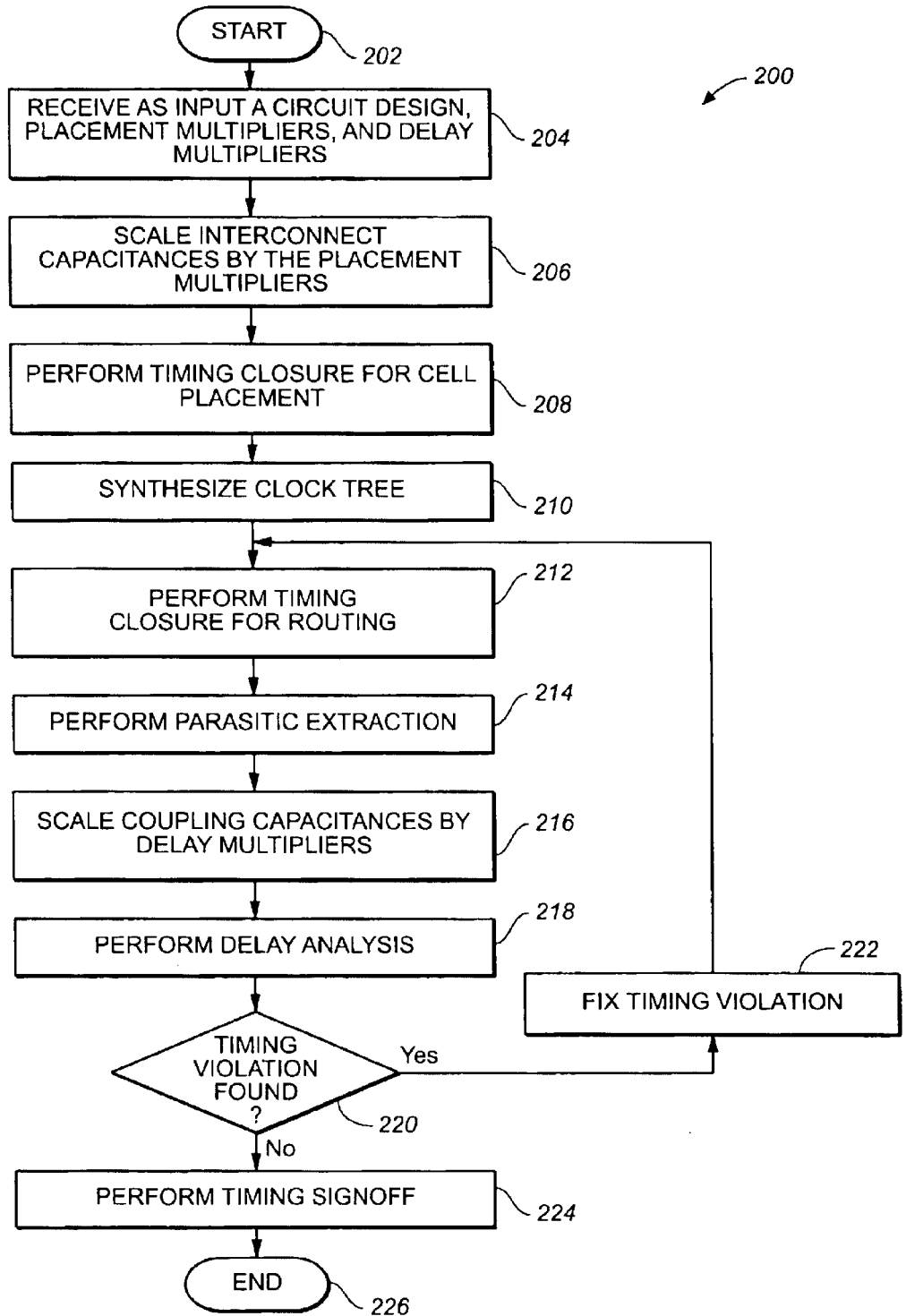
FIG._2

INTEGRATED CIRCUIT DESIGN FLOW WITH CAPACITIVE MARGIN

FIELD OF THE INVENTION

The present invention relates generally to methods of designing electronic circuits. More specifically, but without limitation thereto, the present invention relates to a method of designing integrated circuits that simplifies the design flow of integrated circuits by introducing appropriate capacitive margins.

BACKGROUND OF THE INVENTION

In previous methods for designing integrated circuits, several iterations of cell placement, routing and signal analysis of the capacitive effects of the interconnections are typically required to satisfy timing constraints, sometimes requiring weeks of cross-talk analysis after parasitic extraction is performed on the circuit floorplan. Because cross-talk analysis is so time consuming, it presents a significant bottleneck in the design cycle of integrated circuits.

SUMMARY OF THE INVENTION

In one aspect of the present invention, a design flow for an integrated circuit design includes a capacitive margin that significantly reduces the number of iterations in the design flow and avoids the necessity of cross-talk analysis. Instead, an incremental crosstalk delay is estimated and associated with each net. Each critical path has a corresponding individual incremental crosstalk delay that is added to the path delay. The incremental crosstalk delay accounts for real interconnect capacitance and coupling effects for each interconnect by scaling the interconnect and coupling capacitances with individually adjustable margin multipliers.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a flow chart of a typical integrated circuit design flow of the prior art; and FIG. 2 illustrates a flow chart of a design flow for an integrated circuit according to an embodiment of the present invention.

DESCRIPTION OF THE ILLUSTRATED EMBODIMENTS

In one aspect of the present invention, a method of designing an integrated circuit includes receiving as input a representation of a circuit design and a margin factor and scaling a parameter value in the circuit design by the margin factor to account for coupling in the circuit design. The margin factor advantageously reduces the number of iterations in the design flow and avoids the necessity of cross-talk analysis. Instead, an incremental crosstalk delay is estimated and associated with each net. Specifically, interconnect and coupling capacitances are scaled using margin factors, which may be considered as individually adjustable Miller factors. Each critical path has a corresponding individual incremental crosstalk delay that is added to the path delay. The design flow of the present invention may be used with a variety of different semiconductor technologies.

A typical design flow of an integrated circuit generates as output a file in standard parasitic exchange format (SPEF) with wire capacitances and coupling capacitances (CcSPEF) and a file with interconnect and cell delays in standard delay format (SDF).

FIG. 1 illustrates a flow chart 100 of a typical integrated circuit design flow of the prior art.

Step 102 is the entry point of the flow chart 100.

In step 104, a first timing closure step is performed on the netlist of a circuit design to ensure that circuit timing constraints are met during cell placement.

In step 106, a clock tree is synthesized for the clocked cells in the circuit design.

In step 108, a second timing closure step is performed to ensure that circuit timing constraints are met during routing.

In step 110, a parasitic extraction is performed to determine the capacitances of the wires and a standard parasitic exchange format (SPEF) file is generated containing the parasitic extraction data.

In step 112, a delay and crosstalk analysis is performed. This is typically the most time-consuming step in the circuit design. A cross-talk back-annotated standard delay format (SDF) file is generated that includes the delay and crosstalk analysis data.

In step 114, if the delay and crosstalk analysis finds any timing violations, then control is transferred to step 116. Otherwise, control is transferred to step 118.

In step 116, a cross-talk repair is performed to fix the timing violations. Cross-talk repair may be done, for example, by changing the routing or by re-sizing cells, either manually or with automation tools. When the timing errors have been corrected, control is transferred back to step 108.

In step 118, a timing sign-off is performed. Timing signoff is the final step of timing closure after routing has been completed. At this point, all timing reports are clear of timing violations, and these timing reports are generated as output along with the SPEF and SDF files.

Step 120 is the exit point of the flow chart 100.

Disadvantageously, the method of circuit design described with respect to the flow chart 100 requires several iterations to meet timing closure, and the crosstalk analysis in step 110 is especially time-consuming.

An important feature of the present invention is that the cross-coupling capacitance of the interconnect parasitic network used for delay calculations is margined, that is, scaled by a margin factor, so that detailed cross-talk analysis (delay shift analysis) is unnecessary. By avoiding cross-talk analysis, a significant savings in setup, computation, and interpretation is realized. The margined delay calculations have been demonstrated to adequately bracket the delay shift due to cross-talk as seen in detailed cross-talk analysis, while minimizing the overall magnitude of the margin factors. In other words, the source of the cross-talk problem is margined rather than applying more general margins.

Another important feature of the present invention is the application of margin factors to the wire capacitance during cell placement to avoid timing violations.

The margin factors M=MWC have a value of more than one for the worst case (setup margin), and the margin factors M=MBC have a value of less than one for the best case (hold margin). The margin factors M=MWC and M=MBC have different values for different design tools and in different stages of the circuit design. The margin factors are technology dependent, and are preferably maintained in a technology parameters library so that the same design flow may be used with a variety of different technologies. Third party technology files need not be changed, because cross-talk avoidance and analysis is preferably performed using non-margined coupling capacitance values.

Noise and delay analysis following cell placement are unnecessary, since the capacitive margins, that is, the margin factors, are embedded in the technology parameters library used in the design flow. Power, ground, and guard nets are appropriately accounted for, because they are represented by grounded capacitances in the SPEF and CcSPEF files. Clock nets are not margined if they are shielded or otherwise protected by additional space, or if specified by the user not to be margined.

During cell placement, there is no available information for the coupling capacitances between wires, because routing is not performed until after cell placement. To account for coupling capacitances in advance, all wire capacitances are scaled by a margin factor. The margin factors used in conjunction with cell placement are referred to as the placement multipliers M=MWC_p for setup margin and M=MBC_p for hold margin. Exemplary values are 1.1 for setup margin and 0.95 for hold margin, respectively. The new wire capacitance for cell placement is given by formula (1):

$$C\_wire\_new = M * C\_wire \quad (1)$$

where C_wire is the wire capacitance.

More information for the coupling capacitances (Cc) between wires is available during delay analysis. At this stage, to account for actual coupling between wires, all coupling wire capacitances are scaled using initial values of the delay multipliers M=MWC_d=1.5 and M=MBC_d=0.5.
The new wire capacitance for delay analysis is then given by formula (2):

$$C\_wire\_new = C\_wire + M * Cc \quad (2)$$

where C_wire is the wire capacitance to ground.

For a more accurate estimation of coupling capacitance under worst case conditions, the delay multipliers M=MWC_D may be expressed as a heuristic function of the ratio of the coupling capacitance Cc to the total capacitance as follows:

$$M=2.0 \text{ if } 0.00 < CC/C\_t \leq 0.1$$

$$M=1.5 \text{ if } 0.01 < CC/C\_t \leq 0.2$$

$$M=2.0 \text{ if } 0.02 < CC/C\_t \leq 0.3$$

$$M=1.5 \text{ if } 0.03 < CC/C\_t \leq 0.5$$

$$M=1.5 \text{ if } 0.05 < CC/C\_t \leq 1.0 \quad (3)$$

where C_t=C_wire+Cc. Other values and conditions may be used in the heuristic function of the ratio of the coupling capacitance Cc to the total capacitance C_t to suit specific applications in various embodiments of the present invention.

Although the embodiments of the present invention illustrated herein are specifically directed to wire capacitances and cross-coupling wire capacitances of the wire interconnections, other circuit values may be margined in various embodiments of the present invention to simplify design flows for a variety of applications and technologies.

FIG. 2 illustrates a flow chart 200 of a design flow for an integrated circuit according to an embodiment of the present invention.

Step 202 is the entry point of the flow chart 200.

In step 204, a representation of a circuit design, placement multipliers, and delay multipliers are received as input. The representation of a circuit design may be, for example, a standard netlist. The placement multipliers and the delay multipliers are included in the margin factors stored in the technology parameters library.

In step 206, the capacitances of the interconnect wires in the circuit design are scaled by the placement multipliers as described above.

In step 208, a first timing closure step is performed to ensure that circuit timing constraints are met during cell placement. In contrast to the design flow illustrated in FIG. 1, the cell placement is enhanced by including the wire capacitances scaled by the placement multipliers MWC_p and M=MBC_p.

In step 210, a clock tree is synthesized for the clocked cells in the circuit design according to well known techniques.

In step 212, a second timing closure step is performed to ensure that circuit timing constraints are met for the circuit design during routing.

In step 214, a parasitic extraction is performed to determine the coupling capacitances of each of the interconnection wires, and a standard parasitic exchange format (SPEF) file is generated containing the parasitic extraction data.

In step 216, the coupling capacitance of each of the wire interconnects is scaled by the appropriate delay multiplier.

In step 218, a simplified delay analysis is performed to determine whether any timing violations exist. In contrast to the detailed delay and cross-talk analysis in the design flow of FIG. 1, the simplified delay analysis is enhanced by scaling the coupling capacitance of the interconnection wires by the delay multipliers. Also in contrast to the design flow illustrated in FIG. 1, cross-talk analysis is avoided in the design flow 200 by scaling the coupling capacitances of the interconnection wires by the delay multipliers. A cross-talk back-annotated standard delay format (SDF) file is generated from the simplified delay analysis.

In step 220, if the delay analysis discovers a timing violation, then control is transferred to step 222. Otherwise, control is transferred to step 224.

In step 222, the timing violation is corrected manually or automatically, and control is transferred back to step 212.

In step 224, a timing sign-off is performed and the timing reports are generated as output with the SPEF and SDF files.

Step 226 is the exit point of the flow chart 200.

The exemplary flow chart described above has been shown with reference to specific steps performed in a specific order; however, these steps may be combined, sub-divided, or reordered in other embodiments without departing from the scope of the claims. Except as specifically indicated herein, the order and grouping of steps is not a limitation of the present invention.

The methods illustrated in the flowchart description above may be embodied in a computer program product and implemented by a computer according to well known programming techniques to perform the following functions:

(a) receiving as input a representation of a circuit design, a placement multiplier, and a delay multiplier;

(b) scaling a capacitance of an interconnect wire in the circuit design by the placement multiplier;

(c) performing a first timing closure step to ensure that circuit timing constraints are met during cell placement;

(d) synthesizing a clock tree for clocked cells in the circuit design;

(e) performing a second timing closure step to ensure that circuit timing constraints are met for the circuit design during routing of the interconnect wire in the circuit design;

(f) performing a parasitic extraction to determine a coupling capacitance of the interconnect wire;

(g) scaling the coupling capacitance by the delay multiplier;

(h) performing a delay analysis on the circuit design to determine whether a timing violation exists;

(i) if a timing violation is discovered, then transferring control to (j), else transferring control to (k);

(j) correcting the timing violation and transferring control back to (e); and (k) generating a timing sign-off report.

In another embodiment, the computer program generates as output a standard parasitic exchange format (SPEF) file from the parasitic extraction function performed in step (f). In yet another embodiment, the computer program generates as output a standard delay format (SDF) file from the delay analysis function performed in step (h). The SPEF and SDF files may be used with other design tools according to well known techniques in further embodiments of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of designing an integrated circuit comprising steps of:

(a) receiving as input a representation of a circuit design, a placement multiplier, and a delay multiplier;

(b) scaling a capacitance of an interconnect wire in the circuit design by the placement multiplier;

(c) performing a placement timing closure before routing to ensure that circuit timing constraints are met during cell placement; (d) performing a routing timing closure to ensure that circuit timing constraints are met for the circuit design during routing of the interconnect wire in the circuit design;

(e) performing a parasitic extraction to determine a coupling capacitance of the interconnect wire;

(f) scaling the coupling capacitance by the delay multiplier;

(g) performing a delay analysis to determine whether a timing violation exists;

(h) if a timing violation exists, then transferring control to (i), else transferring control to (j); (i) correcting the timing violation and transferring control back to (d); and (j) generating a timing sign-off report.

2. The method of claim 1 further comprising a step of generating a standard parasitic exchange format file from the parasitic extraction.

3. The method of claim 1 further comprising a step of generating a standard delay format file from the delay analysis.

4. The method of claim 1 further comprising a step of maintaining the placement multiplier and the delay multiplier in a technology parameters library.

5. The method of claim 1 wherein the delay multiplier comprises a heuristic function of the ratio of a coupling capacitance to a total capacitance.

6. A computer program product for designing an integrated circuit comprising:

a medium for embodying a computer program for input to a computer; and a computer program embodied in the medium for causing the computer to perform the following functions:

(a) receiving as input a representation of a circuit design, a placement multiplier, and a delay multiplier;

(b) scaling a capacitance of an interconnect wire in the circuit design by the placement multiplier;

(c) performing a placement timing closure before routing to ensure that circuit timing constraints are met during cell placement; (d) performing a routing timing closure to ensure that circuit timing constraints are met for the circuit design during routing of the interconnect wire in the circuit design;

(e) performing a parasitic extraction to determine a coupling capacitance of the interconnect wire;

(f) scaling the coupling capacitance by the delay multiplier;

(g) performing a delay analysis to determine whether a timing violation exists;

(h) if a timing violation exists, then transferring control to (i), else transferring control to (j);

(i) correcting the timing violation and transferring control back to (d); and (j) generating a timing sign-off report.

7. The computer program product of claim 6 further comprising a step of generating a standard parasitic exchange format file from the parasitic extraction.

8. The computer program product of claim 6 further comprising a step of generating a standard delay format file from the delay analysis.

9. The computer program product of claim 6 further comprising a step of maintaining the placement multiplier and the delay multiplier in a technology parameters library.

10. The computer program product of claim 6 wherein the delay multiplier comprises a heuristic function of the ratio of a coupling capacitance to a total capacitance.

11. A method of designing an integrated circuit comprising steps of:

(a) receiving as input a representation of a circuit design, a placement multiplier, and a delay multiplier;

(b) scaling a capacitance of an interconnect wire in the circuit design by the placement multiplier; (c) performing a placement timing closure before routing to ensure that circuit timing constraints are met during cell placement;

(d) performing a routing timing closure to ensure that circuit timing constraints are met for the circuit design during routing of the interconnect wire in the circuit design;

(e) performing a parasitic extraction to determine a coupling capacitance of the interconnect wire;

(f) scaling the coupling capacitance by the delay multiplier; and (g) performing a delay analysis to determine whether a timing violation exists.

* * * * *